(12) United States Patent
Lu et al.

(10) Patent No.: US 10,484,036 B1
(45) Date of Patent: Nov. 19, 2019

(54) POLARIZATION CONVERTER SYSTEMS AND METHODS

(71) Applicant: Lattice Semiconductor Corporation, Portland, OR (US)

(72) Inventors: Rongrong Lu, San Jose, CA (US); Ron Zeng, San Jose, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 15/999,631

(22) Filed: Aug. 20, 2018

Related U.S. Application Data

(60) Provisional application No. 62/687,731, filed on Jun. 20, 2018.

(51) Int. Cl.
| | |
|---|---|
| *H04B 1/04* | (2006.01) |
| *H04B 1/40* | (2015.01) |
| *H05K 1/16* | (2006.01) |
| *H05K 3/10* | (2006.01) |
| *G01S 7/00* | (2006.01) |

(52) U.S. Cl.
CPC ............ *H04B 1/40* (2013.01); *H05K 1/162* (2013.01); *H05K 1/165* (2013.01); *H05K 3/10* (2013.01); *G01S 7/003* (2013.01); *H05K 2201/09036* (2013.01); *H05K 2201/10098* (2013.01)

(58) Field of Classification Search
CPC .................................. H04B 1/40; H05K 1/162
See application file for complete search history.

(56) References Cited

U.S. PATENT DOCUMENTS

| | | | | |
|---|---|---|---|---|
| 2011/0243562 | A1* | 10/2011 | Jackson | H01P 1/2138 398/65 |
| 2016/0146724 | A1* | 5/2016 | Gao | G01J 3/0205 250/269.1 |

* cited by examiner

*Primary Examiner* — Tuan H Nguyen
(74) *Attorney, Agent, or Firm* — Haynes and Boone, LLP

(57) ABSTRACT

Systems and methods for polarization converters are disclosed. An example wireless communication system includes a first transceiver module of a wireless communication system configured to form one or more linearly polarized communication links with a second transceiver module of the wireless communication system, and a polarization converter positioned between the first and second transceiver modules and configured to convert the one or more linearly polarized communication links to circularly polarized communication links. The polarization converter includes first and second frequency selective surfaces (FSSs) formed from respective first and second metalized layers of a printed circuit board (PCB), each FSS includes an array of capacitive patches and inductive traces forming an array of unit cells, and each unit cell of the second FSS is aligned with each unit cell of the first FSS.

20 Claims, 12 Drawing Sheets

300 →  322  326

| | Distance | Dock to Mobile | | Mobile to Dock | |
|---|---|---|---|---|---|
| | | Bit Rate | Err Rate (Pre FEC) | Bit Rate | Err Rate (Pre FEC) |
| 0 Degrees | 45mm | 5.5 | 0 | 5.5 | 0 |
| | 20mm | 5.5 | 0 | 5.5 | 0 |
| | 10mm | 5.5 | 0 | 5.5 | 0 |
| 45 Degrees | 45mm | 5.5 | 0 | 5.5 | 12178 |
| | 20mm | 5.5 | 0 | 5.5 | 0 |
| | 10mm | 5.5 | 0 | 5.5 | 0 |
| 90 Degrees | 45mm | 0 | \ | 0 | \ |
| | 20mm | 5.5 | NAN | 5.5 | NAN |
| | 10mm | 5.5 | NAN | 5.5 | 0 |
| | 3 mm | 5.5 | 0 | 5.5 | 0 |
| 135 Degrees | 45mm | 5.5 | 2839 | 5.5 | 0 |
| | 20mm | 5.5 | 0 | 5.5 | 0 |
| | 10mm | 5.5 | 0 | 5.5 | 0 |
| 180 Degrees | 45mm | 5.5 | 0 | 5.5 | 0 |
| | 20mm | 5.5 | 0 | 5.5 | 0 |
| | 10mm | 5.5 | 0 | 5.5 | 0 |
| 225 Degrees | 45mm | 5.5 | 140364 | 5.5 | 636 |
| | 20mm | 5.5 | 0 | 5.5 | 0 |
| | 10mm | 5.5 | 0 | 5.5 | 0 |
| 270 Degrees | 45mm | 0 | \ | 0 | \ |
| | 20mm | 0 | \ | 5.5 | NAN |
| | 10mm | 0 | \ | 5.5 | NAN |
| | 3mm | 5.5 | 43 | 5.5 | 0 |
| 315 Degrees | 45mm | 5.5 | 0 | 5.5 | 190 |
| | 20mm | 5.5 | 0 | 5.5 | 0 |
| | 10mm | 5.5 | 0 | 5.5 | 0 |

Fig. 3

| Direction | Distance | Mobile | Dock | Mobi fd_bitcnt | Mobi bch_err_cnt | Dock fd_bitcnt | Dock bch_err_cnt |
|---|---|---|---|---|---|---|---|
| With Converter Mobile Face to Trace and Dot Side | 5mm | 0 | 0 | 5.5G | 0 | 5.5G | 0 |
| | | 0 | 45 | 5.5G | 0 | 5.5G | 0 |
| | | 0 | 90 | 5.5G | 0 | 5.5G | 0 |
| | 10mm | 0 | 0 | 5.5G | 0 | 5.5G | 0 |
| | | 0 | 45 | 5.5G | 0 | 5.5G | 0 |
| | | 0 | 90 | 5.5G | 0 | 5.5G | 0 |
| | 15mm | 0 | 0 | 5.5G | 0 | 5.5G | 0 |
| | | 0 | 45 | 5.5G | 0 | 5.5G | 0 |
| | | 0 | 90 | 5.5G | 0 | 5.5G | 0 |
| | 20mm | 0 | 0 | 5.5G | 0 | 5.5G | 0 |
| | | 0 | 45 | 5.5G | 0 | 5.5G | 0 |
| | | 0 | 90 | 5.5G | 0 | 5.5G | 0 |
| With Out Converter | 5mm | 0 | 0 | 5.5G | NAN | 5.5G | 601 |
| | | 0 | 45 | 5.5G | 0 | 5.5G | 0 |
| | | 0 | 90 | 5.5G | 0 | 5.5 | NAN |
| | 10mm | 0 | 0 | 0 | 0 | 5.5G | 0 |
| | | 0 | 45 | 5.5G | 0 | 5.5G | 0 |
| | | 0 | 90 | 5.5G | 0 | 5.5G | 0 |
| | 15mm | 0 | 0 | 5.5G | 0 | 5.5G | 0 |
| | | 0 | 45 | 5.5G | 0 | 5.5G | 0 |
| | | 0 | 90 | 5.5G | 0 | 5.5G | 0 |
| | 20mm | 0 | 0 | 0 | | 5.5G | 0 |
| | | 0 | 45 | 5.5G | 0 | 5.5G | 0 |
| | | 0 | 95 | 5.5G | 0 | 5.5 | NAN |

Fig. 9

POLARIZATION CONVERTER SYSTEMS AND METHODS

CROSS REFERENCE TO RELATED APPLICATIONS

This application claims priority to and the benefit of U.S. Provisional Patent Application No. 62/687,731 filed Jun. 20, 2018, which is incorporated herein by reference in its entirety.

TECHNICAL FIELD

The present disclosure relates generally to wireless communication devices, and in particular, to high bandwidth systems and/or architectures with enhanced reliability when subjected to motion.

BACKGROUND

There is continuing interest in miniaturizing and increasing the performance of wireless communication devices. Therefore, their antennas often support multiple wireless communication links, and those wireless communication links are typically closely packed. The small distance between the communication links has the potential to increase mutual coupling between them, hence increasing the risk of interference and performance degradation.

Conventional wireless communication devices often rely on isolation methodologies requiring orthogonal linear polarization of adjacent wireless communication links. Such methodologies can work well when the wireless communication links operate between appropriately aligned and relatively stationary devices, but they do not provide satisfactory performance when the relative orientation between the two devices changes over time, for example, or when the distance between the devices increases beyond a relatively limited gap distance. Some conventional wireless communication device designs may include antenna and drive systems configured to generate different link polarizations to increase performance under such conditions, but such conventional designs are often expensive and/or mechanically complex to implement or result in an effective gap distance that is impractical.

Thus, there is a need in the art for a compact and inexpensive-to-implement wireless communication architecture that can operate reliably while the relative orientation between constituent devices changes over time.

BRIEF DESCRIPTION OF THE FIGURES

FIG. 3 is a graph illustrating rotary communication link performance for a wireless communication system in accordance with an embodiment of the present disclosure.

FIG. 9 is a graph illustrating a comparison of rotary communication linkage performance for a wireless communication system incorporating a polarization converter in accordance with an embodiment of the present disclosure.

Figure 1:
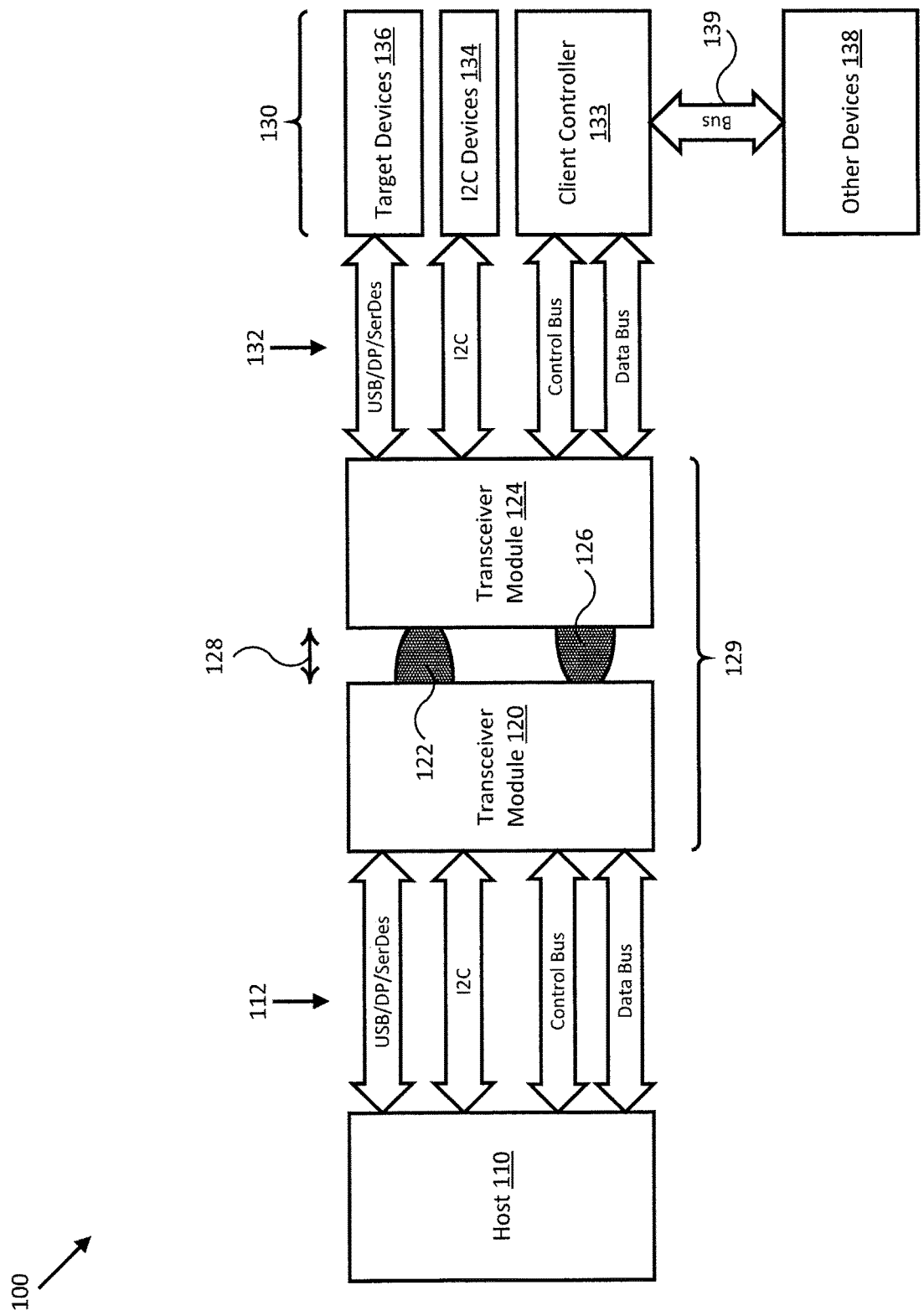
FIG. 1 is a block diagram illustrating wireless communication system in accordance with an embodiment of the present disclosure.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

The present disclosure provides systems and methods for enhanced communication performance in wireless communication systems expected to experience relative motion. For example, embodiments provide systems and methods of improving performance of a wireless communication system expected to provide one or more rotary wireless communication links by including a polarization converter disposed between transceivers of the wireless communication system. The polarization converter converts incident linear polarized wireless communication links to circularly polarized wireless communication links by, at least in part, creating a 90 degree phase difference between electromagnetic wave components of the incident linearly polarized wireless communication links, thereby generating the circularly polarized wireless communication links, as described herein.

In various embodiments, such polarization converter is implemented by multiple frequency selective surfaces (FSSs) including two dimensionally anisotropic periodic structures patterned out of the metalized layers of a printed circuit board (PCB), for example, and the FSSs and/or PCB may be selected, patterned, and/or arranged such that electromagnetic wave reflections generated at each FSS substantially cancel each other out (e.g., destructively interfere), thereby resulting in relatively low reflection and insertion loss, as measured by the transceivers. Advantageously, embodiments may be formed from relatively low cost PCB dielectric material (e.g., FR-4, FR-5, FR-6, polymide, G-10, G-11, and/or other relatively low cost PCB material) using common (and also relatively inexpensive) PCB patterning techniques and tolerances. However, if higher performance/less loss is required, more expensive PCB materials/substrate materials may be used, such as Rogers RO3000 and/or CuClad material.

FIG. 1 is a block diagram illustrating wireless communication system 100 in accordance with an embodiment of the present disclosure. As shown in FIG. 1, system 100 may include a host 110 with a host transceiver module 120 separated by and communicating wirelessly over a gap distance 128 with client devices 130 each coupled to a client transceiver module 124, where transceiver modules 120 and 124 are configured to form one or more linearly polarized wireless communication links 122, 126 and form communication linkage 129. In various embodiments, communication linkage 129 may be a stationary or rotary communication linkage, for example, and may include one or multiple individual half or full duplex linearly polarized wireless communication links 122, 126. In particular embodiments, linearly polarized wireless communication link 122 is polarized orthogonally to linearly polarized wireless communication link 126 in order to provide signal isolation between the two links, and each link 122, 126 may be formed with an axial ratio (e.g., ratio of signal strength at principal polarization angle to signal strength at corresponding orthogonal polarization angle) greater than 20 dB. Under such conditions, each of linearly polarized wireless communication links 122, 126 may be configured to operate within the same 60 GHz mmWave frequency band and to support up to 6 Gbps data bandwidths.

In general, host 110 communicates universal serial bus (USB) data, inter-integrated circuit (I2C) data, and/or other control or data signals over host buses 112 to host transceiver module 120, and host transceiver module 120 is configured to establish linearly polarized wireless communication link 122 with client transceiver module 124 and communicate control and/or data signals from host buses 112 to client transceiver module 124. Client transceiver module 124 communicates received control and/or data signals over client buses 132 to one or more client devices 130, such as target devices 136, I2C devices/peripherals 134, client controller 133, and/or to other devices 138 via client controller 133 and bus 139, as shown. Such process may be reversed to communicate control and/or data signals from client devices 130 to host 110. Host and/or client buses 112 and 132 may include one or more USB 2.0/3.0 buses, display port buses, serializer/deserializer (SerDes) buses, I2C buses, and/or other or additional control and/or data buses, for example, and all data from all buses may be conveyed between transceiver modules 120 and 124 wirelessly, up to the maximum bandwidth supported by the one or more established wireless communication links of communication linkage 129.

As shown in the embodiment illustrated in FIG. 1, system 100 includes host 110 and client controller 133. Host 110 and/or client controller 133 may each be implemented as any appropriate logic device (e.g., processing device, microcontroller, processor, application specific integrated circuit (ASIC), field programmable gate array (FPGA), memory storage device, memory reader, or other device or combinations of devices) that may be adapted to execute, store, and/or receive appropriate instructions, such as software instructions implementing a control loop for controlling various operations of client controller 133, client devices 130, transceiver modules 120 and 124, and/or other elements of system 100, for example. Such software instructions may also implement methods for processing sensor signals, determining sensor information, providing user feedback (e.g., through a display), querying devices for operational parameters, selecting operational parameters for devices, or performing any of the various methods described herein.

In various embodiments, host 110 and/or client controller 133 may each be implemented with a machine readable medium for storing non-transitory instructions for loading into and execution by host 110 or client controller 133. In these and other embodiments, host 110 and/or client controller 133 may be implemented with other components where appropriate, such as volatile memory, non-volatile memory, one or more interfaces, and/or various analog and/or digital components for interfacing with various modules of system 100. For example, host 110 may be adapted to store sensor signals, sensor information, parameters for coordinate frame transformations, calibration parameters, sets of calibration points, and/or other operational parameters, over time, for example, and provide such stored data to a display (e.g., an optional element of host 110).

In typical embodiments, host 110 may be tasked with overseeing general operation of system 100, generating imagery from sensor data, correlating sensor data/imagery, communicating operational parameters and/or sensor information with other devices through communication linkage 129, and/or other operations of system 100. In such embodiments, client controller 133 may be implemented with relatively high resolution timing circuitry capable of generating digital transmission and/or sampling control signals for operating a LIDAR system (e.g., other devices 138) and/or other devices of system 100, for example, and other time critical operations of system 100, as described herein.

Transceiver modules 120 and 124 may each be implemented with one or more digital to analog converters (DACs), signal shaping circuits, filters, phase adjusters, signal conditioning elements, amplifiers, attenuators, timing circuitry, logic devices, and/or other digital and/or analog electronics configured to accept digital control signals from host 110 and/or client controller 133 and to provide analog transmission signals to form one or more wireless communication links, as described herein. In various embodiments, overall operation of transceiver modules 120 and 124 (e.g., amplification, attenuation, phase shifting, and/or other signal adjustments) may be controlled (e.g., through use of the various control signals) by host 110 and/or client controller 133.

Other devices 138 may include one or more additional interfaces, feedback devices, support electronics, and/or environmental sensors, such as a physical user interface device (e.g., a joystick, rotating selector, button), indicator, battery or power supply/charging circuit, strap or lanyard, wired or wireless communications interface, external memory slot or interface, speaker, microphone, fingerprint sensor, pulse monitor, digital light/image projector, accelerometer/gyroscope, global navigation satellite system (GNSS) receiver, LTDAR system and/or other ranging sensor system, and/or other electronic modules or devices.

In various embodiments, client devices 130 may be configured to control and/or implement a sensor system, such as a LIDAR system or other rotary ranging sensor system, and sensor data corresponding to a detected object (e.g., range and/or direction to such detected object) may be communicated to host 110 using communication linkage 129, as shown. Such arrangement can be particularly helpful when one or more of client devices 130 includes an articulated sensor element, such as a rotating LIDAR sensor element, for example, where a wired communication link between host 110 any client devices 130 may be relatively difficult or expensive to implement. As shown in FIG. 1, other devices 138 may include one or more articulated sensor elements, for example, including a LIDAR sensor element configured to rotate about an axis roughly perpendicular to the adjacent faces of host transceiver module 120 and client transceiver module 124. Such rotation may be through a full 360 degrees and may occur at various revolution rates, including 1 Hz (1 revolutions per second), 10 Hz, or greater.

Figure 2:
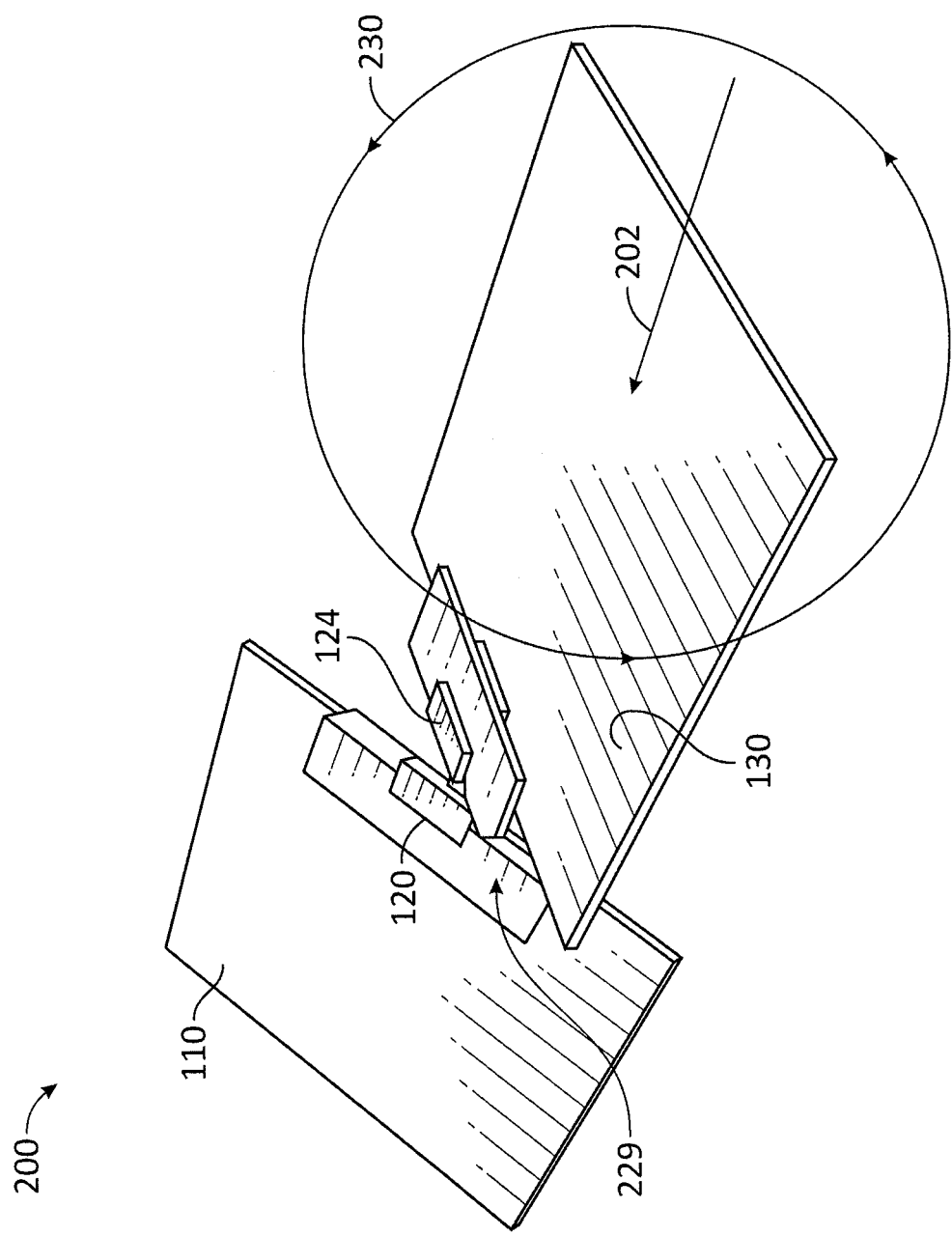
FIG. 2 is a schematic diagram illustrating a rotary communication link of a wireless communication system in accordance with an embodiment of the present disclosure.

FIG. 2 is a schematic diagram illustrating a rotary communication linkage 229 of wireless communication system 200 in accordance with an embodiment of the present disclosure. As shown in FIG. 2, wireless communication system includes dock or host 110 and mobile or client devices 130 communicating over rotary communication linkage 229 via host transceiver module 120 and client transceiver module 124, while client devices 130 rotate about axis 202 according to rotation direction 230. In various embodiments, such rotation would occur normally during operation of an actuated and/or rotating LIDAR system including one or more LIDAR sensor elements integrated with client devices 130.

FIG. 3 is a graph 300 illustrating rotary communication link performance for wireless communication system 200 in accordance with an embodiment of the present disclosure. In particular, graph 300 shows how data transmission performance degrades as a function of angular offset about axis 202 and according to rotation direction 230, and as a function of gap distance 128 along axis 202. As can be seen from column 322 of graph 300, linearly polarized wireless communication link 122 shows significant degradation and/ or link failure at 90 and 270 degrees relative orientation and/or at relatively large gap distances, and from column 326 of graph 300, linearly polarized wireless communication link 126 also shows significant degradation and/or link failure at 90 and 270 degrees relative orientation and/or at relatively large gap distances. While not shown explicitly in FIG. 3, relatively fast revolution rates of rotary communication linkage 229 (including both linearly polarized wireless communication links 122 and 126) can also result in significant communication link degradation and/or failure, across all relative orientations, because transceiver modules 120 and 124 are unable to modulate their gain circuitry quickly enough to keep up with the signal to noise modulation caused by such rotation.

For example, when each of communication links 122 and 126 are implemented with axial ratios of greater than 20 dB, and rotary communication linkage 229 is subject to a 10 Hz revolution rate, transceiver modules 120 and 124 would be required to adjust the gain of their receiver circuitry by more than 20 dB at 20 Hz (two times the revolution rate) to maintain reliable communications. Gain circuitry that can handle such rates may be available, but they are typically relatively expensive and/or error prone and may require further modification to compensate for the contemplated gap distances, as shown in FIG. 3. Because it is expensive both in teuiis of cost and delay to redesign transceiver modules 120 and 124 to include such circuitry or to generate nonlinearly polarized wireless communication links, it is desirable to provide a polarization converter that may be added to system 100 or 200 to convert linearly polarized communication links 122 and 126 to a polarization less susceptible to detrimental rotary effects, as shown in graph 300.

Figure 4:
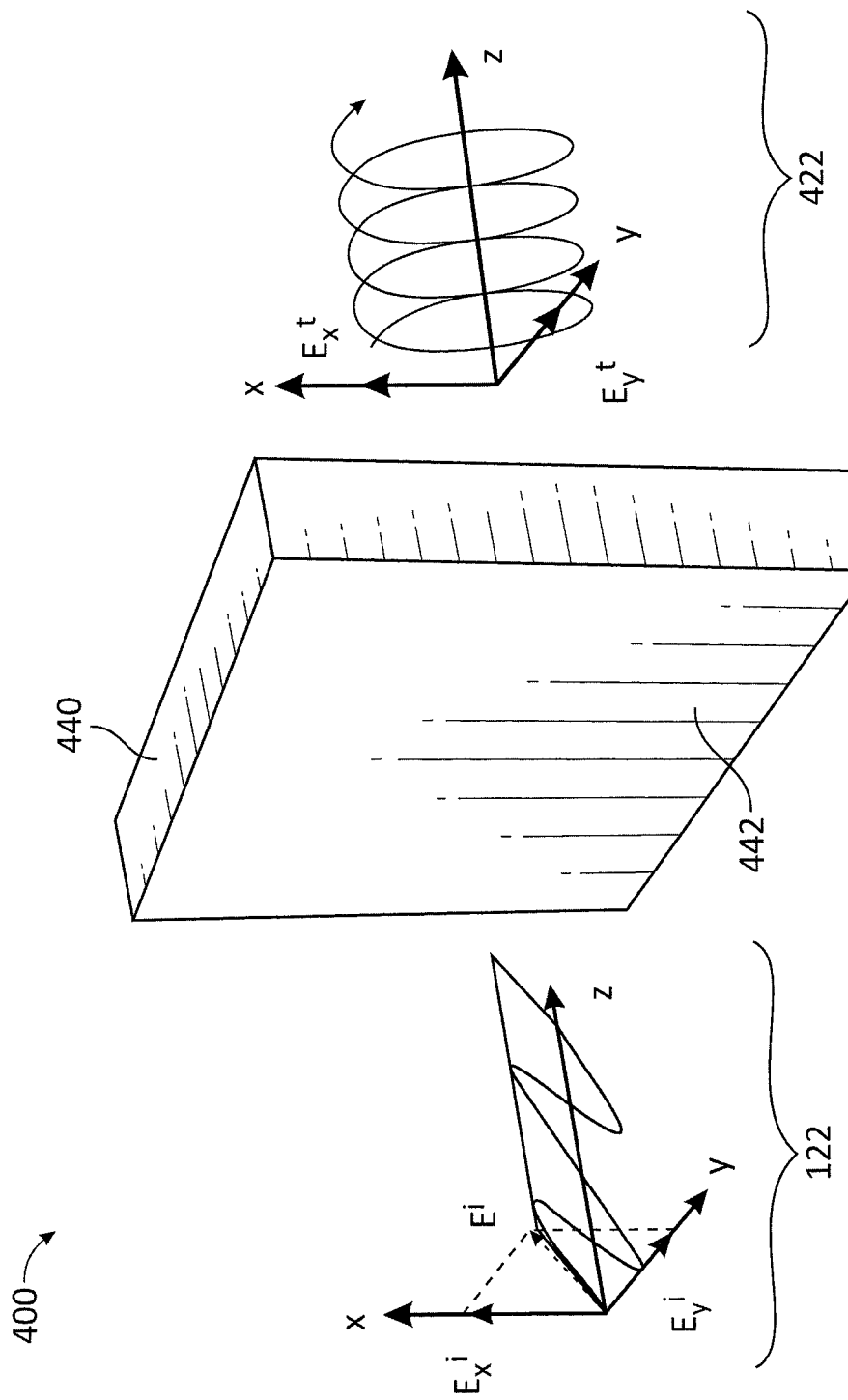
FIG. 4 is a schematic diagram illustrating a polarization converter for a wireless communication system in accordance with an embodiment of the present disclosure.

FIG. 4 is a schematic diagram 400 illustrating a polarization converter 440 for wireless communication system 100 or 200 in accordance with an embodiment of the present disclosure. In FIG. 4, diagram 400 shows linearly polarized wireless communication link 122 (e.g., polarized according to a 45 degree angle between the x and y axes shown in diagram 400) incident onto polarization converter 440 and converted into circularly polarized wireless communication link 422. As shown in diagram 400, polarization converter 440 may include one or more FSSs 442, as described more fully herein. More generally, any linearly polarized electromagnetic waves or signals incident upon polarization converter 440 may be converted into circularly polarized electromagnetic waves or signals when passing through polarization converter 440. Such circularly polarized electromagnetic waves or signals may couple more reliably to a receiver of transceiver module 120 and/or 124 than a rotating linearly polarized wave or signal, while subjected to relative angular offsets and/or rotation rates, as described herein.

Figure 5A:
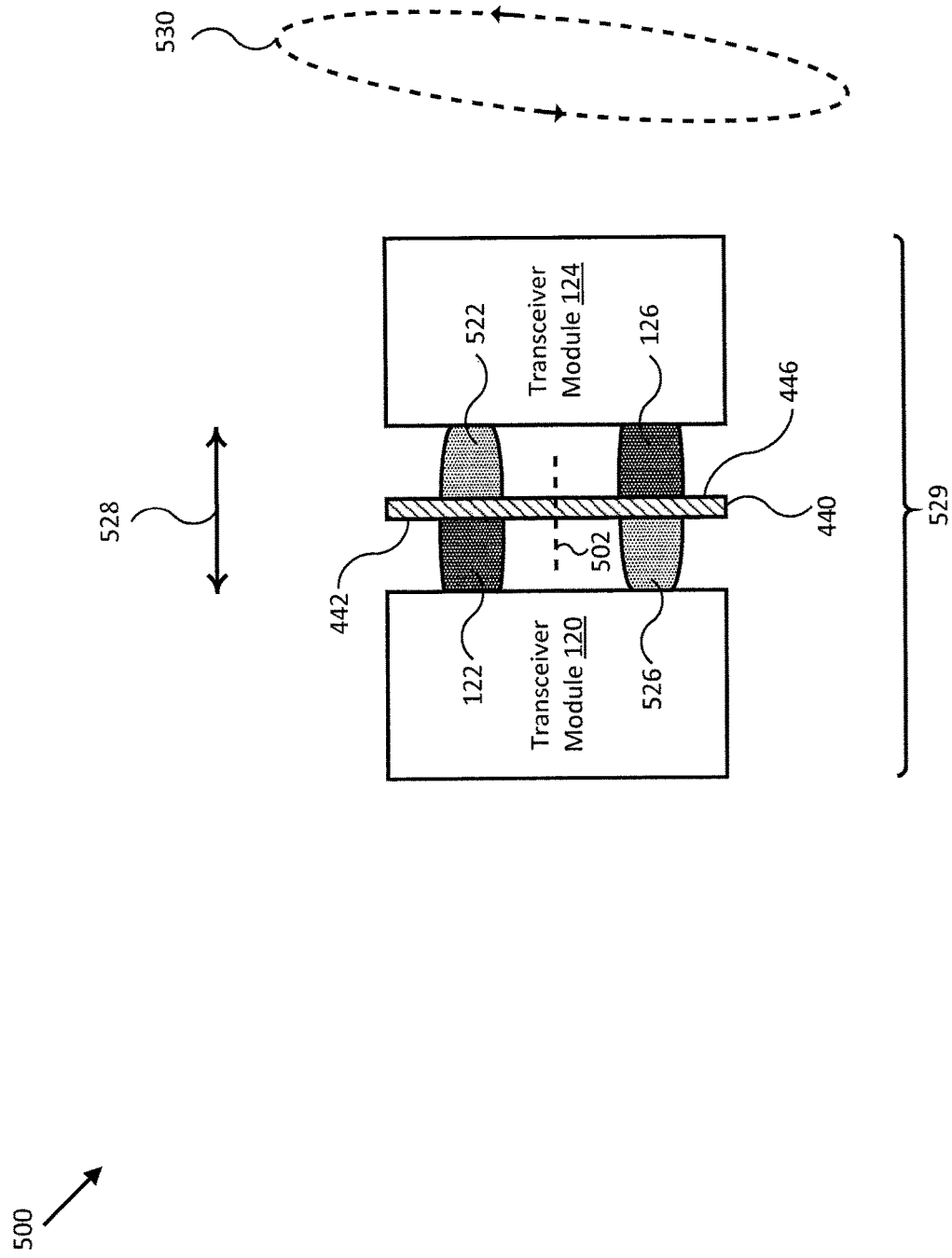
FIG. 5A is a block diagram illustrating a rotary communication linkage of a wireless communication system incorporating a polarization converter in accordance with an embodiment of the present disclosure.

FIG. 5A is a block diagram illustrating a rotary communication linkage 529 of a wireless communication system 500 incorporating a polarization converter 440 in accordance with an embodiment of the present disclosure. As shown in FIG. 5A, wireless communication system 500 (e.g., an embodiment of wireless communication systems 100 and/or 200) includes rotary communication linkage 529 generated by client transceiver module 124 (e.g., and any coupled client devices 130) rotating according to rotation direction 530 roughly about central axis 502 that is normal to the plane in which polarization converter 440 resides. In the embodiment shown in FIG. 5A, polarization converter 440 includes first and second FSSs 442 and 446, where the pair of FFSs are configured to convert incident linearly polarized wireless communication link 122 into circularly polarized wireless communication link 522, and incident linearly polarized wireless communication link 126 into circularly polarized wireless communication link 526. Polarization converter 440 and first and second FSSs 442 and 446 may work similarly in embodiments where linearly polarized wireless communication links 122 and 126 are full duplex wireless links (e.g., bidirectional wireless links). In various embodiments, polarization converter 440 may be formed from a two layer PCB, and first and second FSSs 442 and 446 may be formed from the two metalized layers of the two layer PCB. In some embodiments, the shape and/or pattern of first and second FSSs 442 and 446 and/or a thickness of polarization converter 440 may be selected to reduce reflections generated by the incident wireless links by generating reflections of such incident signals at first and second FSSs 442 and 446 that substantially cancel each other out (e.g., destructively interfere), thereby resulting in relatively low reflection and insertion loss, as measured by transceiver modules 120 and 124. In various embodiments, polarization converter 440 may be coupled or affixed to, or otherwise held stationary relative to an orientation of transceiver module 120, or first polarization converter 440 may be coupled or affixed to, or otherwise held stationary relative to an orientation of transceiver module 124, such that polarization converter 440 rotates with transceiver module 124 according to rotation direction 530.

Figure 5B:
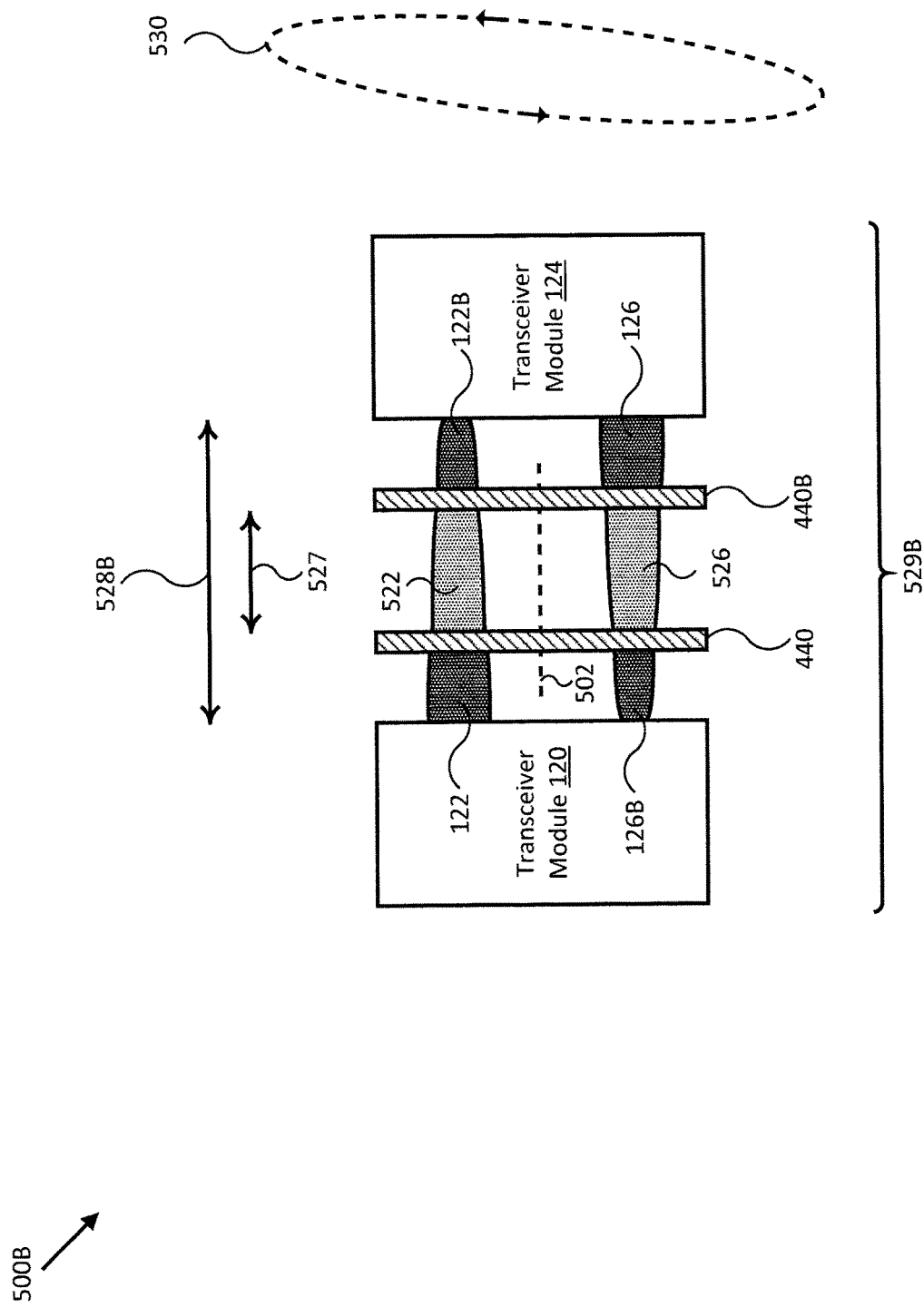
FIG. 5B is a block diagram illustrating a rotary communication linkage of a wireless communication system incorporating two polarization converters in accordance with an embodiment of the present disclosure.

FIG. 5B is a block diagram illustrating a rotary communication linkage 529B of a wireless communication system 500B incorporating two polarization converters 440, 440B in accordance with an embodiment of the present disclosure. For example, in cases where gap distance 528 needs to be as large as possible, embodiments of system 500 may include a rotary communication linkage 529 that itself includes first and second polarization converters 440 and 440B (e.g., similar in construction to polarization converter 440) to convert respective linearly polarized wireless communication links 122 and 126 to circularly polarized wireless communication links 522 and 526 through a portion 527 of (extended) gap distance 528B, and to convert respective circularly polarized wireless communication links 526 and 522 to secondary linearly polarized wireless links 122B and 126B, for reception by transceiver modules 120 and 124 as shown. In various embodiments, first polarization converter 440 may be oriented relative to transceiver module 120 and second polarization converter 440B may be oriented relative to transceiver module 124 such that linearly polarized communication links 122B and 126B are aligned with transceiver modules 122 and 124, as shown. By incorporating such structure, embodiments of rotary communication linkage 529B are able to substantially eliminate the approximate 3 dB mismatch loss associated with use of a single polarization converter 440 (e.g., the mismatch loss between an incident circularly polarized signal and a receiver configured to receive linearly polarized signals, as described herein).

In various embodiments, first polarization converter 440 may be coupled or affixed to, or otherwise held stationary relative to an orientation of transceiver module 120, and second polarization converter 440B may be coupled or affixed to, or otherwise held stationary relative to an orientation of transceiver module 124, such that second polarization converter 440B rotates with transceiver module 124 according to rotation direction 530. In related embodiments, an orientation of second polarization converter 440B may be offset approximately 90 degrees from an orientation of polarization converter 440, as measured when linearly polarized wireless communication links 122 and 126 are aligned with transceiver modules 120 and 124 (e.g., as if polarization converters 440 and 440B are absent and transceiver modules 120 and 124 are aligned relative to axis 502 and at gap distance 528 to maximize performance and/or signal strength of wireless communication links 122 and 126, such as with static communication linkage 129 of FIG. 1).

Figure 6:
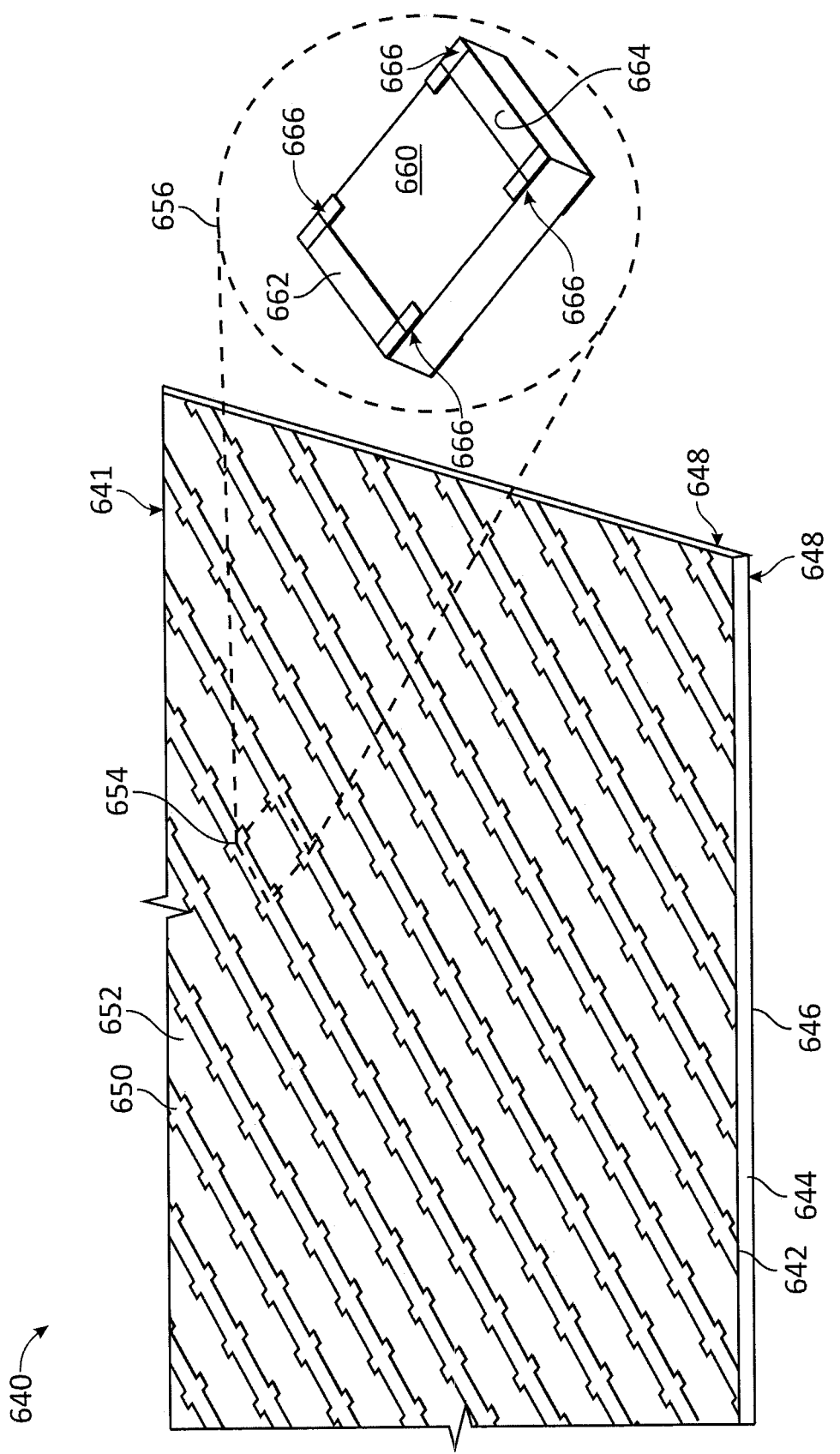
FIG. 6 is a perspective diagram illustrating a polarization converter for a wireless communication system in accordance with an embodiment of the present disclosure.

FIG. 6 is a perspective diagram illustrating a polarization converter 640 for wireless communication systems 100, 200, and/or 500 in accordance with an embodiment of the present disclosure. In FIG. 6, polarization converter 640 is formed from a two layer PCB 641 that includes metalized layers 642 and 646 laminated to either side of dielectric layer 644 (e.g., a PCB material, as described herein). Polarization converter 640 includes a first FSS patterned into top metalized layer 642 and includes an array of parallel metal traces 650 formed across the full surface of PCB 641 from cut edge 648 to cut edge 648 and leaving a corresponding array of dielectric cavity strips 652 (e.g., portions of dielectric layer 644 uncovered by patterning of metalized layer 642). The array of metal traces 650 and array of dielectric cavity strips 654 may be portioned into an array of individual unit cells 654 (shown in more detail in expanded view 656). Each unit cell 654 includes a central rectangular dielectric cavity 660 bounded on a first pair of opposing sides by metal traces 662 and 664 and metal stubs 666 extending from ends of metal traces 662 and 664 into central rectangular dielectric cavity 660. The remaining pair of opposing sides or perimeter of central rectangular dielectric cavity 660 are open with respect to dielectric cavities of adjoining unit cells within the same FSS/metalized layer 642. A similar pattern of unit cells 654 may be formed in (bottom) metalized layer 646 to form a second FSS, for example, where the center and orientation of each unit cell 654, relative to metal traces 662 and 664, is aligned with the center and orientation of a corresponding unit cell formed in metalized layer 646. In some embodiments, the pattern of unit cells formed in metalized layer 646 may be formed such that the spacing between such cells is the same as the spacing of unit cells 654 formed in metalized layer 642, but the thickness (e.g., measured along a surface of metalized layer 646, as opposed to normal to the plane in which metalized layer 646 resides) of corresponding metal traces and stubs (e.g., from a perimeter of each unit cell) is reduced by a selected percentage, such as 20 or 30%, relative to the pattern of metal traces 650 foiled in metalized layer 642.

More generally, polarization converter 640 may be implemented as an array of subwavelength capacitive patches and inductive traces (e.g., unit cells 654) found according to an anisotropic periodic repeating pattern, as shown. Linearly polarized wireless communication links transmitted towards polarization converter 640, such that their polarization direction is roughly 45 degrees offset from the direction corresponding to the long axis of metal traces 650, will be converted relatively efficiently to corresponding circularly polarized wireless links. At different relative angles, such conversion is typically less efficient. In various embodiments, polarization converter 640 may be affixed to host transceiver module 120 such that the long axis of metal traces 650 are permanently positioned at a 45 degree angle relative to the polarization angle of the transmitter(s) and receiver(s) of host transceiver module 120. In other embodiments, polarization converter 640 may instead be affixed to client transceiver module 124 according to similar requirements. In the embodiment shown in FIG. 6, polarization converter 640 is configured to convert 57 GHz to 64 GHz linearly polarized mmWave wireless links or signals to circularly polarized mmWave wireless links or signals. For polarization converter 640, the 3 dB axial ratio bandwidth may be 25% with respect to a center operating frequency of 60.5 GHz at normal incidence to polarization converter 640, and the insertion loss may be less than 1 dB and the reflection less than −10 dB.

Figure 7:
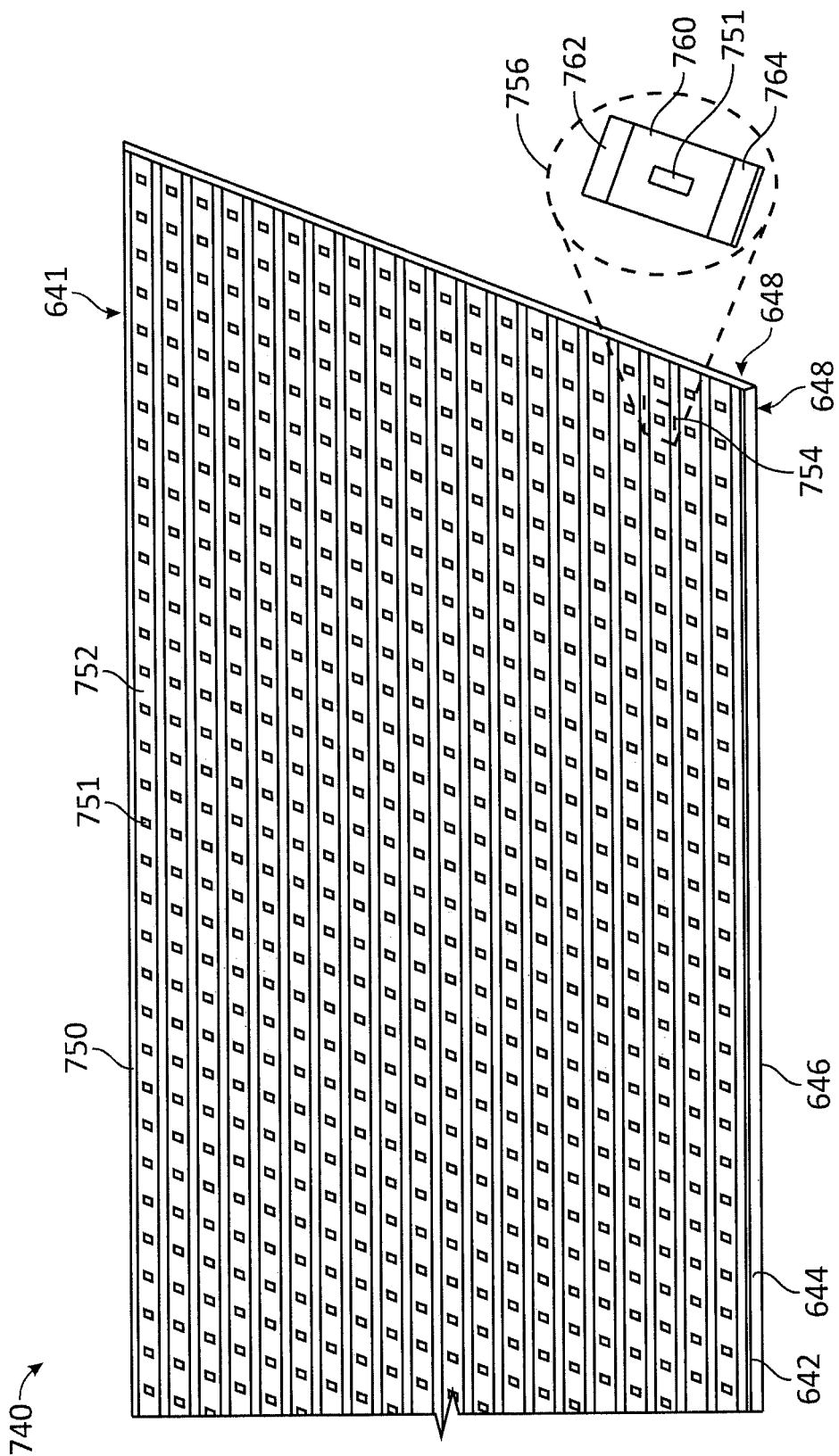
FIG. 7 is a perspective diagram illustrating a polarization converter for a wireless communication system in accordance with an embodiment of the present disclosure.

FIG. 7 is a perspective diagram illustrating a polarization converter 740 for wireless communication systems 100, 200, and/or 500 in accordance with an embodiment of the present disclosure. In FIG. 7, polarization converter 740 is formed from two layer PCB 641 that includes metalized layers 642 and 646 laminated to either side of dielectric layer 644 (e.g., similar to polarization converter 640, as described herein). Polarization converter 740 includes a first FSS patterned into top metalized layer 642 and includes an array of parallel metal traces 750 and rectangular or square metal patches 751 formed across the full surface of PCB 641 across cut edges 648 and leaving a corresponding array of dielectric cavities 752. The array of metal traces 750, array of rectangular or square metal patches 751, and array of dielectric cavities 752 may be portioned into an array of individual unit cells 754 (shown in more detail in expanded view 756). Each unit cell 754 includes a central rectangular dielectric cavity 760 bounded on a first pair of opposing sides by metal traces 762 and 764. The remaining sides or perimeter of central rectangular dielectric cavity 760 are open with respect to dielectric cavities of adjoining unit cells within the same FSS/metalized layer 642. Each unit cell 754 also includes the central rectangular or square metal patch 751, such that a long axis of metal patch 751 is aligned perpendicularly to metal traces 762 and 764, as shown.

A similar pattern of unit cells 754 may be formed in (bottom) metalized layer 646 to form a second FSS, for example, where the center and orientation of each unit cell 754, relative to metal traces 762 and 764, is aligned with the center and orientation of a corresponding unit cell formed in metalized layer 646. In some embodiments, the pattern of unit cells formed in metalized layer 646 may be forming such that the spacing between such cells is the same as the spacing of unit cells 754 formed in metalized layer 642, but where the thickness (e.g., measured along a surface of metalized layer 646, as opposed to normal to the plane in which metalized layer 646 resides) of corresponding metal traces and patches (e.g., from a perimeter of each unit cell) is reduced by a selected percentage, such as 20 or 30%, relative to the pattern of metal traces 750 and patches 751 formed in metalized layer 642.

More generally, polarization converter 740 may be implemented as an array of subwavelength capacitive patches and inductive traces (e.g., unit cells 754) formed according to an anisotropic periodic repeating pattern, as shown. Linearly polarized wireless communication links transmitted towards polarization converter 740, such that their polarization direction is roughly 45 degrees offset from the direction corresponding to the long axis of metal traces 750, will be converted relatively efficiently to corresponding circularly polarized wireless links. At different relative angles, such conversion is typically less efficient. In various embodiments, polarization converter 740 may be affixed to host transceiver module 120 such that the long axis of metal traces 750 are permanently positioned at a 45 degree angle relative to the polarization angle of the transmitter(s) and receiver(s) of host transceiver module 120. In other embodiments, polarization converter 740 may instead be affixed to client transceiver module 124 according to similar requirements. In the embodiment shown in FIG. 7, polarization converter 740 is configured to convert 57 GHz to 64 GHz linearly polarized mmWave wireless links or signals to circularly polarized mmWave wireless links or signals. For polarization converter 740, the 3 dB axial ratio bandwidth may be 25% with respect to a center operating frequency of 60.5 GHz at normal incidence, and the insertion loss may be less than 1 dB and the reflection less than −10 dB.

Figure 8:
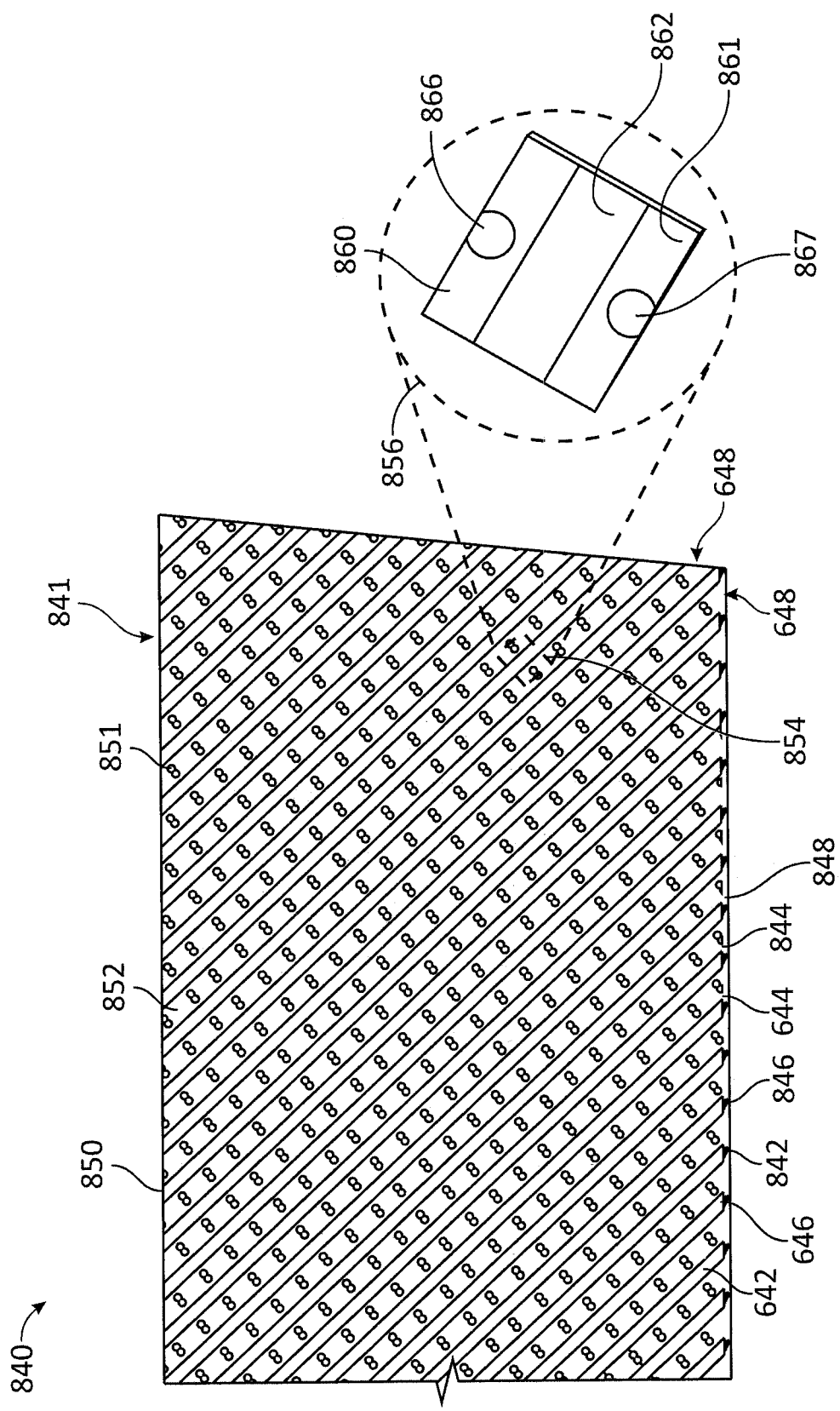
FIG. 8 is a perspective diagram illustrating a polarization converter for a wireless communication system in accordance with an embodiment of the present disclosure.

FIG. 8 is a perspective diagram illustrating a polarization converter 840 for wireless communication systems 100, 200, and/or 500 in accordance with an embodiment of the present disclosure. In FIG. 8, polarization converter 840 is formed from a four layer PCB 841 that includes metalized layers 642, 646, 842, and 846 laminated to dielectric layers 644, 844, and 848, as shown. Polarization converter 840 includes a first FSS patterned into top metalized layer 642 and includes an array of parallel metal traces 850 and a pair of circular metal patches 851 formed across the full surface of PCB 841 across cut edges 648 and leaving a corresponding array of dielectric cavities 852. The array of metal traces 850, array of pairs of circular metal patches 851, and array of dielectric cavities 852 may be portioned into an array of individual unit cells 854 (shown in more detail in expanded view 856). Each unit cell 854 includes a pair of rectangular dielectric cavities 860 and 861 split by a metal trace 862. The remaining sides or perimeters of the pair of rectangular dielectric cavities 860 and 861 are open with respect to dielectric cavities of adjoining unit cells within the same FSS/metalized layer 642 (e.g., each on three sides of unit cell 854, at least partially). Each rectangular dielectric cavity of each unit cell 854 also includes one circular metal patch 851, such that the center of each circular metal patch 851 is aligned with a midpoint of a long axis of a corresponding rectangular dielectric cavity 860 or 861 and is not in electrical contact with (e.g., is physically separate from) metal trace 862. In some embodiments, each circular metal patch 851 may be positioned or sized to be in electrical contact with a circular metal patch of an adjoining unit cell.

A similar pattern of unit cells 854 may be formed in metalized layers 646, 842, and 846 to form a respective second, third, and fourth FSS, for example, where the center and orientation of each unit cell 854, relative to metal trace 862, is aligned with the center and orientation of corresponding unit cells formed in metalized layers 646, 842, and 846. In some embodiments, the pattern of unit cells formed in metalized layers 646, 842, and 846 may be formed such that the spacing between such cells is the same as the spacing of unit cells 854 formed in metalized layer 642, but where the thickness (e.g., measured along a surface of metalized layer 646, as opposed to normal to the plane in which metalized layer 646 resides) of corresponding metal traces (e.g., from a perimeter of each unit cell) and circular patch diameters is reduced by a selected percentage, such as 20 or 30%, relative to the pattern of metal traces 850 and patches 851 forming in metalized layer 842. More specifically, an array of unit cells formed in metalized layer 646 may be dimensionally reduced a selected percentage relative to unit cells 854 in metalized layer 642, an array of unit cells formed in metalized layer 842 may be dimensionally reduced a selected percentage relative to unit cells in metalized layer 646, and an array of unit cells formed in metalized layer 846 may be dimensionally reduced a selected percentage relative to unit cells in metalized layer 842, to form a staggered dimensionally reduced four layer polarization converter 840.

More generally, polarization converter 840 may be implemented as an array of subwavelength capacitive patches and inductive traces (e.g., unit cells 854) formed according to an anisotropic periodic repeating pattern, as shown. Linearly polarized wireless communication links transmitted towards polarization converter 840, such that their polarization direction is roughly 45 degrees offset from the direction corresponding to the long axis of metal traces 850, will be converted relatively efficiently to corresponding circularly polarized wireless links. At different relative angles, such conversion is typically less efficient. In various embodiments, polarization converter 840 may be affixed to host transceiver module 120 such that the long axis of metal traces 850 are permanently positioned at a 45 degree angle relative to the polarization angle of the transmitter(s) and receiver(s) of host transceiver module 120. In other embodiments, polarization converter 840 may instead be affixed to client transceiver module 124 according to similar requirements. In the embodiment shown in FIG. 8, polarization converter 840 is configured to convert 57 GHz to 64 GHz linearly polarized mmWave wireless links or signals to circularly polarized mmWave wireless links or signals. For polarization converter 840, the 3 dB axial ratio bandwidth may be 65% with respect to a center operating frequency of 60.5 GHz at normal incidence, and the insertion loss may be less than 1 dB and the reflection less than −10 dB. As such, embodiments of polarization converter 840 may provide a wider reliable operational range for wireless communication systems, such as an increased gap distance and/or an increased revolution rate, relative to embodiments shown in FIGS. 6-7.

In various embodiments, the patterns of unit cells 654, 754, and 854 may each be implemented in two layer PCBs, four layer PCBs, or PCBs with additional metalized layers each supporting an FSS formed according to such unit cells, as described herein, so as to balance cost (e.g., PCBs with fewer layers are less expensive to fabricate and/or pattern appropriately) and performance for a particular application and/or operating environment.

FIG. 9 is a graph 900 illustrating a comparison of rotary communication linkage performance for wireless communication systems 100, 200, and/or 500 incorporating polarization converters 440, 640, 740, or 840, in accordance with an embodiment of the present disclosure. As can be seen in rows 922 of graph 900, operation of wireless communication systems 100, 200, and/or 500 without a polarization converter results in degraded or failed operation at 90 degrees relative orientation even at 10 mm gap distance. As can be seen in rows 942 of graph 900, operation of wireless communication systems 100, 200, and/or 500 with a polarization converter (e.g., one of polarization converters 440, 640, 740, or 840) can be reliable across all relative orientations and up through at least 20 mm gap distance, as shown.

Figure 10:
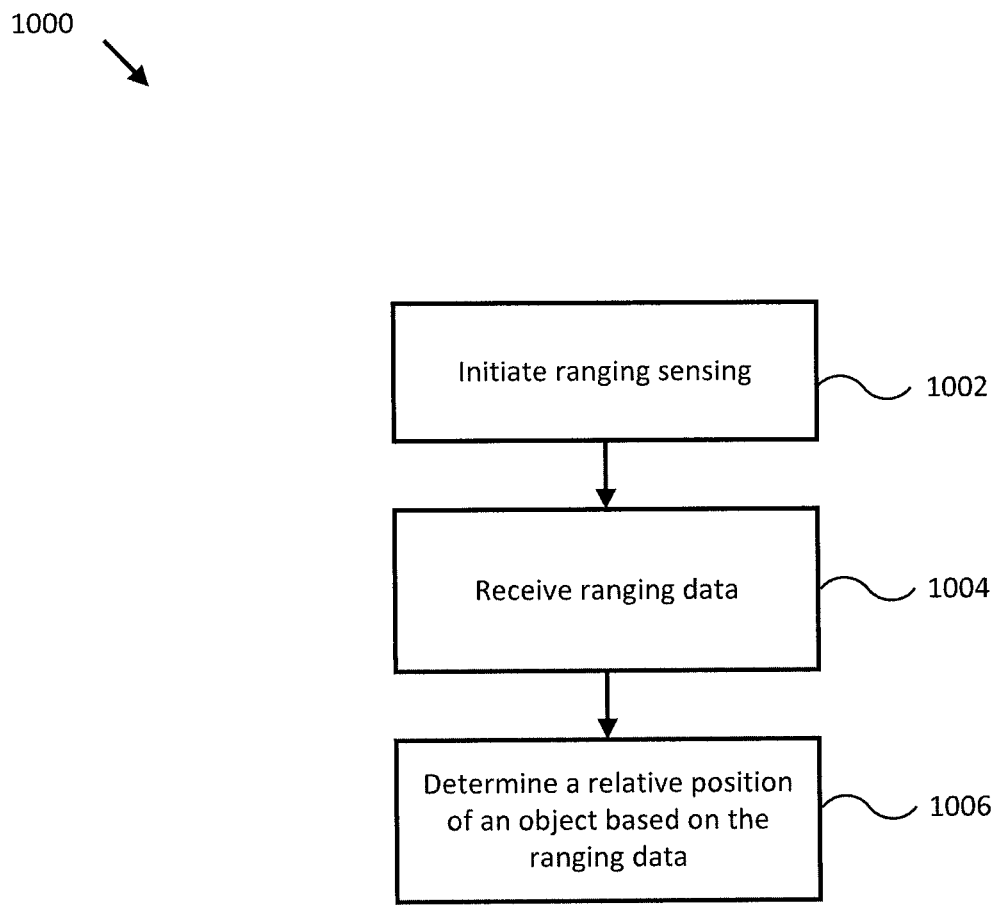
FIG. 10 illustrates a process determine the relative position of an object using a rotary ranging sensor system incorporating a wireless communication system in accordance with an embodiment of the disclosure.

FIG. 10 illustrates a process to determine the relative position (e.g., direction and/or range) of an object using a rotary ranging sensor system incorporating a wireless communication system in accordance with an embodiment of the disclosure. In some embodiments, the operations of FIG. 10 may be implemented as software instructions executed by one or more logic devices associated with corresponding electronic devices, sensors, and/or structures depicted in FIGS. 1 through 9. More generally, the operations of FIG. 10 may be implemented with any combination of software instructions and/or electronic hardware (e.g., inductors, capacitors, amplifiers, actuators, or other analog and/or digital components). It should be appreciated that any step, sub-step, sub-process, or block of processes 1000 may be performed in an order or arrangement different from the embodiments illustrated by FIG. 10. For example, in other embodiments, one or more blocks may be omitted from process 1000, and other blocks may be included. Furthermore, block inputs, block outputs, various sensor signals, sensor information, calibration parameters, and/or other operational parameters may be stored to one or more memories prior to moving to a following portion of process 1000. Although process 1000 is described with reference to systems 100, 200, and 500, and FIGS. 1-9, process 1000 may be performed by other systems different from systems 100, 200, and 500 and including a different selection of electronic devices, sensors, assemblies, and/or transceiver module arrangements. At the initiation of process 1000, various system parameters may be populated by prior execution of a process similar to process 1000, for example, or may be initialized to zero and/or one or more values corresponding to typical, stored, and/or learned values derived from past operation of process 1000, as described herein.

In block 1002, a logic device initiates ranging sensing. For example, host 110 of system 100 may be configured to initiate ranging sensing by a LIDAR system (e.g., client controller 133 and/or other devices 138) and/or other rotary ranging sensor system by communicating one or more control and or data signals over host buses 112 to transceiver module 120, across one or more wireless communication links 122, 522, 126, 526 to transceiver module 124, and over client busses 132 to client controller 133, other devices 138, and/or other client devices 130. Because the linearly polarized wireless communication links 122 and 126 are converted to circularly polarized communication links 522 and 526 by polarization converter 440, such control and/or data signals may be communicated over rotary communication linkage 529 while client devices 130 are rotating about axis 502.

In block 1004, a logic device receives ranging data. For example, host 110 of system 100 may be configured to receive ranging data from a LIDAR system (e.g., client controller 133 and/or other devices 138) by receiving ranging sensor data communicated over client buses 132 to transceiver module 124, across one or more wireless communication links 122, 522, 126, 526 to transceiver module 120, and over host busses 112. Because the linearly polarized wireless communication links 122 and 126 are converted to circularly polarized communication links 522 and 526 by polarization converter 440, such ranging sensor data may be communicated over rotary communication linkage 529 while client devices 130 are rotating about axis 502.

In block 1006, a logic device determines a relative position of an object based on ranging data. For example, host 110 may be configured to determine a range and/or direction to an object detected by a LIDAR system (e.g., client controller 133 and/or other devices 138) based on ranging sensor data received in block 1004.

By employing the methods described herein, including combinations of different or alternative methods, embodiments of the present disclosure are able to efficiently and reliably detect and/or differentiate between one or multiple objects within an available detection area that can be scanned by a ranging sensor system, such as a LIDAR system. Devices including polarization converters, as described herein, are able to operate more reliably at higher revolution rates and detect objects and update object positions and/or other characteristics over shorter time periods.

Figure 11:
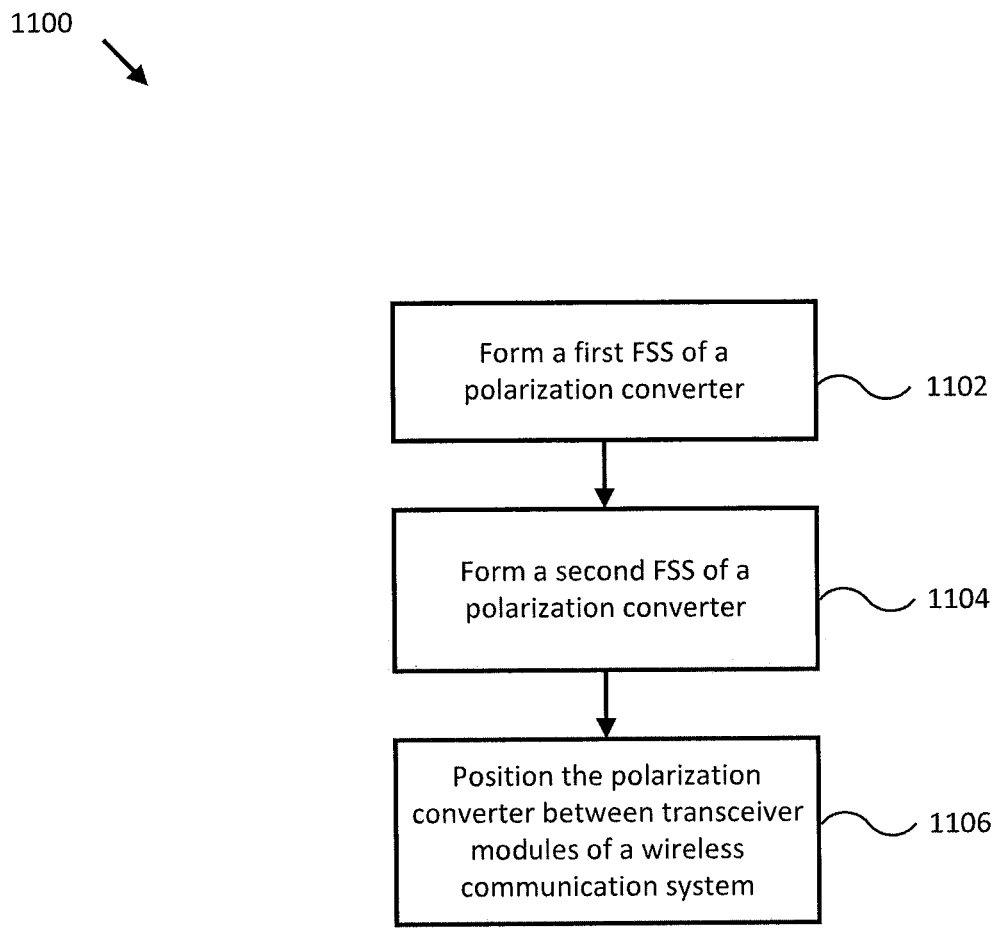
FIG. 11 illustrates a process for forming a polarization converter for a wireless communication system, in accordance with an embodiment of the disclosure.

FIG. 11 illustrates a process 1100 for forming a polarization converter for wireless communication systems 100, 200, and/or 500, in accordance with an embodiment of the disclosure. In some embodiments, the operations of FIG. 11 may be implemented as software instructions executed by one or more logic devices associated with an integrated circuit and/or PCB patterning, fabrication, and/or assembly system. More generally, the operations of FIG. 11 may be implemented with any combination of software instructions and/or electronic hardware (e.g., inductors, capacitors, amplifiers, actuators, antennas, phase adjustors, amplifiers, other analog and/or digital components, deposition systems, etching or patterning systems, or other electronic or electrical fabrication systems). It should be appreciated that any step, sub-step, sub-process, or block of process 1100 may be performed in an order or arrangement different from the embodiments illustrated by FIG. 11. For example, in other embodiments, one or more blocks may be omitted from process 1100, and other blocks may be included. Furthermore, block inputs, block outputs, various sensor signals, sensor information, calibration parameters, and/or other operational parameters may be stored to one or more memories prior to moving to a following portion of process 1100. Although process 1100 is described with reference to systems 100, 200, and 500 and elements of FIGS. 1-9, process 1100 may be performed with respect to other systems and including a different selection of electronic devices, sensors, assemblies, and/or antenna arrangements. At the initiation of process 1100, various system parameters may be populated by prior execution of a process similar to process 1100, for example, or may be initialized to zero and/or one or more values corresponding to typical, stored, and/or learned values derived from past operation of process 1100, as described herein.

In block 1102, a first FSS of a polarization converter is formed. For example, a controller for a fabrication system may be configured to use the fabrication system to etch, print, or otherwise pattern metalized layer 642 to form various structures of a first FSS of polarization converter 640, 740, and/or 840, as described herein, in PCB 641, 741, or 841. Such first FSS may include an array of parallel metal traces 650, 750, or 850, an array of dielectric cavities or cavity strips 652, 752, or 852, and/or an array of rectangular, square, or circular metal patches 751 or 851, which may each form an array of unit cells, as described herein.

In block 1104, a second FSS of a polarization converter is formed. For example, the controller for the fabrication system used to form the first FSS in block 1102 may be configured to use the fabrication system to etch, print, or otherwise pattern metalized layer 646 to form various structures of a second FSS of polarization converter 640, 740, and/or 840, as described herein, in PCB 641, 741, or 841. Such second FSS may include an array of parallel metal traces 650, 750, or 850, an array of dielectric cavities or cavity strips 652, 752, or 852, and/or an array of rectangular, square, or circular metal patches 751 or 851, which may each form an array of unit cells, as described herein. Such unit cells of the second FSS formed in metalized layer 646 may be aligned with unit cells of the first FSS formed in metalized layer 642, where the center and orientation of each unit cell (e.g., relative to metal traces 650, 750, or 850) is aligned with the center and orientation of a corresponding unit cell formed in metalized layer 646, as described herein.

In further embodiments, where the polarization converter includes additional FSSs, the controller for the fabrication system may be configured to use the fabrication system to etch, print, or otherwise pattern metalized layers 842, 846, and/or additional metal layers, each laminated to a different corresponding dielectric layer 844, 848, and/or additional dielectric layers, and then to align and adhere the individually patterned single layer PCBs to form four layer PCB 841, for example, or other multi-layer polarization converters with more than two FSSs.

In block 1106, a polarization converter is positioned. For example, the controller for the fabrication system used to form the first FSS in block 1102 and/or the second FSS in block 1104 may be configured to use the fabrication system to position the polarization converter formed in blocks 1102 and 1104 between transceiver modules 120, 124 of wireless communication system 500 to form rotary communication linkage 529. In some embodiments, such positioning may include adhering the polarization converter formed in blocks 1102 and 1104 to host transceiver module 120 such that a long axis of metal traces 650, 750, and/or 850 are roughly 45 degrees offset from the polarization direction of linearly polarized wireless communication links 122 and 126 emitted and/or received by host transceiver module 120. In other embodiments, such positioning may include adhering the polarization converter formed in blocks 1102 and 1104 to client transceiver module 122 such that a long axis of metal traces 650, 750, and/or 850 are roughly 45 degrees offset from the polarization direction of linearly polarized wireless communication links 122 and 126 received and/or emitted by client transceiver module 122.

Thus, by providing wireless communication systems including polarization converters, embodiments of the present disclosure provide relatively compact wireless communication systems that operate reliably with rotary communication linkages, which results in increases in both operational gap distances and revolution rates for devices integrated with such wireless communication systems. Moreover, the increased operational gap distances and revolution rates and overall system reliability allows embodiments to faun and maintain wireless communications networks and/or reliably detect objects according to higher sensor data rates than those achievable using conventional methodologies.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A device comprising:
a first transceiver module of a wireless communication system configured to form one or more linearly polarized communication links with a second transceiver module of the wireless communication system; and
a polarization converter positioned between the first and second transceiver modules and configured to convert the one or more linearly polarized communication links to corresponding one or more circularly polarized communication links;
wherein the polarization converter comprises first and second frequency selective surfaces (FSSs) formed from respective first and second metalized layers of a printed circuit board (PCB), each FSS comprises an array of capacitive patches and inductive traces forming an array of unit cells, and each unit cell of the second FSS is aligned with each unit cell of the first FSS.

2. The device of claim 1, wherein:
the first transceiver module comprises a host transceiver module or a client transceiver module;
the polarization converter comprises an array of parallel metal traces formed in the first FSS; and
the first FSS of the polarization converter is coupled to the first transceiver module such that a long axis of the array of parallel metal traces is fixed relative to and offset approximately forty five degrees from a principal polarization direction associated with the first transceiver module.

3. The device of claim 1, further comprising the second transceiver module, wherein:
the second transceiver module comprises a client transceiver module;
the polarization converter comprises an array of parallel metal traces formed in the first FSS; and
the first FSS of the polarization converter is coupled to the client transceiver module such that a long axis of the array of parallel metal traces is fixed relative to and offset approximately forty five degrees from a principal polarization direction associated with the client transceiver module.

4. The device of claim 1, wherein:
each unit cell of the first FSS comprises a central rectangular dielectric cavity, first and second metal traces, and four metal stubs extending from ends of the first and second metal traces into the central rectangular dielectric cavity;

the central rectangular dielectric cavity is bounded on a first pair of opposing sides of the unit cell by the first and second metal traces; and the central rectangular dielectric cavity is open with respect to dielectric cavities of adjoining unit cells on a second pair of opposing side of the unit cell.

5. The device of claim 1, wherein:

each unit cell of the first FSS comprises a central rectangular dielectric cavity, first and second metal traces, and a central rectangular or square metal patch;

the central rectangular dielectric cavity is bounded on a first pair of opposing sides of the unit cell by the first and second metal traces;

the central rectangular dielectric cavity is open with respect to dielectric cavities of adjoining unit cells on a second pair of opposing side of the unit cell; and a long axis of the central rectangular or square metal patch is aligned perpendicularly to the first and second metal traces.

6. The device of claim 1, wherein:

each unit cell of the first FSS comprises first and second rectangular dielectric cavities, a metal trace disposed between the first and second rectangular dielectric cavities, and first and second circular metal patches disposed within the respective first and second rectangular dielectric cavities and physically separate from the metal trace;

each of the first and second rectangular dielectric cavities are open with respect to dielectric cavities of adjoining unit cells on three sides of the unit cell; and a center of each circular metal patch is aligned with a midpoint of a long axis of its rectangular dielectric cavity.

7. The device of claim 1, wherein:

a first spacing of each unit cell of the first FSS is equal to a second spacing of each unit cell of the second FSS; and each unit cell of the second FSS is dimensionally reduced relative to each unit cell of the first FSS.

8. The device of claim 7, wherein:

the polarization converter further comprises third and fourth FSSs formed from respective third and fourth metalized layers of the PCB;

each unit cell of the third FSS is aligned with each unit cell of the second FSS;

each unit cell of the fourth FSS is aligned with each unit cell of the third FSS; and at least one unit cell of the second, third, or forth FSS is dimensionally reduced relative to a corresponding unit cell of the respective first, second, or third FSS.

9. The device of claim 1, wherein the polarization converter comprises a first polarization converter, the device further comprising:

a second polarization converter positioned between the second transceiver module and the first polarization converter and configured to convert the one or more circularly polarized communication links produced by the first polarization converter to secondary linearly polarized communication links aligned with the second transceiver module.

10. A method of determining the position of an object using the device of claim 1, the method comprising:

initiating a rotary ranging sensor system coupled to the second transceiver module by communicating one or more control and/or data signals over the one or more circularly polarized communication links produced by the polarization converter;

receiving ranging sensor data from the rotary ranging sensor system by communicating the ranging sensor data over the one or more circularly polarized communication links produced by the polarization converter; and determining a relative position of an object based on the received ranging sensor data.

11. A method for forming the device of claim 1, comprising:

patterning the first metalized layer of the PCB to form the first FSS of the polarization converter;

patterning the second metalized layer of the PCB to form the second FSS of the polarization converter;

positioning the polarization converter between the first and second transceiver modules.

12. A wireless communication system comprising the device of claim 1, and further comprising:

a host coupled to the first transceiver module and configured to control operation of a client device coupled to the second transceiver module over the one or more linearly polarized communication links;

a memory configured to store a plurality of computer readable instructions which when executed by the host and/or a client controller are adapted to cause the wireless communication system to perform a method comprising:

initiating the client device coupled to the second transceiver module by communicating one or more control and/or data signals over the one or more circularly polarized communication links produced by the polarization converter; and receiving sensor data from the client device by communicating the sensor data over the one or more circularly polarized communication links produced by the polarization converter.

13. The system of claim 12, wherein the polarization converter comprises a first polarization converter, the system further comprising:

a second polarization converter positioned between the second transceiver module and the first polarization converter and configured to convert the one or more circularly polarized communication links produced by the first polarization converter to secondary linearly polarized communication links aligned with the second transceiver module.

14. A wireless communication system, comprising:

a first transceiver module configured to form one or more linearly polarized communication links with a second transceiver module;

a host coupled to the first transceiver module and configured to control operation of a client device coupled to the second transceiver module over the one or more linearly polarized communication links;

a polarization converter positioned between the first and second transceiver modules and configured to convert the one or more linearly polarized communication links to circularly polarized communication links; and a memory configured to store a plurality of computer readable instructions which when executed by the host and/or a client controller are adapted to cause the wireless communication system to perform a method comprising:

initiating the client device coupled to the second transceiver module by communicating one or more control and/or data signals over the one or more circularly polarized communication links produced by the polarization converter; and receiving sensor data from the client device by communicating the sensor data over the one or more circularly polarized communication links produced by the polarization converter;

wherein:

the polarization converter comprises first and second frequency selective surfaces (FSSs) formed from respective first and second metalized layers of a printed circuit board (PCB), each FSS comprises an array of capacitive patches and inductive traces forming an array of unit cells, and each unit cell of the second FSS is aligned with each unit cell of the first FSS;

the polarization converter comprises an array of parallel metal traces formed in the first FSS; and the first FSS of the polarization converter is coupled to the first transceiver module such that a long axis of the array of parallel metal traces is fixed relative to and offset approximately forty five degrees from a principal polarization direction associated with the first transceiver module.

15. A method for forming a polarization converter for a wireless communication system, the method comprising:

patterning a first metalized layer of a printed circuit board (PCB) to form a first frequency selective surface (FSS) of the polarization converter; and patterning a second metalized layer of the PCB to form a second FSS of the polarization converter;

wherein each FSS comprises an array of capacitive patches and inductive traces forming an array of unit cells, and each unit cell of the second FSS is aligned with each unit cell of the first FSS.

16. The method of claim 15, wherein:

each unit cell of the first FSS comprises a central rectangular dielectric cavity, first and second metal traces, and four metal stubs extending from ends of the first and second metal traces into the central rectangular dielectric cavity;

the central rectangular dielectric cavity is bounded on a first pair of opposing sides of the unit cell by the first and second metal traces; and the central rectangular dielectric cavity is open with respect to dielectric cavities of adjoining unit cells on a second pair of opposing side of the unit cell.

17. The method of claim 15, wherein:

each unit cell of the first FSS comprises a central rectangular dielectric cavity, first and second metal traces, and a central rectangular or square metal patch;

the central rectangular dielectric cavity is bounded on a first pair of opposing sides of the unit cell by the first and second metal traces;

the central rectangular dielectric cavity is open with respect to dielectric cavities of adjoining unit cells on a second pair of opposing side of the unit cell; and a long axis of the central rectangular or square metal patch is aligned perpendicularly to the first and second metal traces.

18. The method of claim 15, wherein:

each unit cell of the first FSS comprises first and second rectangular dielectric cavities, a metal trace disposed between the first and second rectangular dielectric cavities, and first and second circular metal patches disposed within the respective first and second rectangular dielectric cavities and physically separate from the metal trace;

each of the first and second rectangular dielectric cavities are open with respect to dielectric cavities of adjoining unit cells on three sides of the unit cell; and a center of each circular metal patch is aligned with a midpoint of a long axis of its rectangular dielectric cavity.

19. The method of claim 15, wherein:

a first spacing of each unit cell of the first FSS is equal to a second spacing of each unit cell of the second FSS; and each unit cell of the second FSS is dimensionally reduced relative to each unit cell of the first FSS.

20. The method of claim 19, wherein:

the polarization converter further comprises third and fourth FSSs formed from respective third and fourth metalized layers of the PCB;

each unit cell of the third FSS is aligned with each unit cell of the second FSS;

each unit cell of the fourth FSS is aligned with each unit cell of the third FSS; and at least one unit cell of the second, third, or forth FSS is dimensionally reduced relative to a corresponding unit cell of the respective first, second, or third FSS.

* * * * *

UNITED STATES PATENT AND TRADEMARK OFFICE
CERTIFICATE OF CORRECTION

PATENT NO. : 10,484,036 B1  
APPLICATION NO. : 15/999631  
DATED : November 19, 2019  
INVENTOR(S) : Rongrong Lu and Ron Zeng Page 1 of 1

It is certified that error appears in the above-identified patent and that said Letters Patent is hereby corrected as shown below:

In the Detailed Description:

In Column 4, Line 51, change "LTDAR" to --LIDAR--

In Column 5, Line 52, change "teuiis" to --terms--

In Column 8, Line 2, change "foiled" to --formed--

In Column 8, Line 6, change "found" to --formed--

In Column 8, Line 62, change "forming" to --formed--

In Column 10, Line 10, change "forming" to --formed--

In Column 13, Line 55, change "faun" to --form--

Signed and Sealed this
Twenty-ninth Day of December, 2020

Andrei Iancu
*Director of the United States Patent and Trademark Office*